United States Patent
Ito et al.

(10) Patent No.: US 8,362,841 B2
(45) Date of Patent: Jan. 29, 2013

(54) CONVERSION CIRCUIT FROM SINGLE PHASE SIGNAL TO DIFFERENTIAL PHASE SIGNAL

(75) Inventors: Makoto Ito, Yokohama (JP); Sosaku Sawada, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/077,099

(22) Filed: Mar. 31, 2011

(65) Prior Publication Data

US 2011/0241777 A1    Oct. 6, 2011

(30) Foreign Application Priority Data

Apr. 1, 2010   (JP) .................. 2010-084985

(51) Int. Cl.
*H03F 3/04* (2006.01)
(52) U.S. Cl. ........................ 330/301; 330/308
(58) Field of Classification Search .................. 330/252, 330/301, 308; 250/241 A, 214 AG
See application file for complete search history.

(56) References Cited

U.S. PATENT DOCUMENTS 7,420,423 B2 *   9/2008   Lee et al. ............... 330/301

FOREIGN PATENT DOCUMENTS

JP   2001-320249   11/2001

* cited by examiner

*Primary Examiner* — Khanh V Nguyen
(74) *Attorney, Agent, or Firm* — Venable LLP; Michael A. Sartori; Tamatane J. Aga

(57) ABSTRACT

A differential amplifier showing a suppressed output offset is disclosed. The differential amplifier includes a pair of differential transistors, a pair of cascode transistors, and a reference generator. One of differential transistors receives an AC signal, while, the other of differential transistors receives an average voltage of the AC signal. The reference generator receives the average voltage of the AC signal and outputs a bias commonly provided to the cascode transistor. The bias is raised by a substantially constant level from the average voltage, which compensates the output offset of the differential amplifier.

11 Claims, 10 Drawing Sheets

CONVERSION CIRCUIT FROM SINGLE PHASE SIGNAL TO DIFFERENTIAL PHASE SIGNAL

BACKGROUND OF THE INVENTION

1. Field of the Invention

The present invention relates to a differential circuit, in particular, the invention relates to a differential circuit with suppressed output offset.

2. Related Prior Art

A Japanese Patent Application published as JP-2001-320249A has disclosed a circuit that includes a trans-impedance amplifier (hereafter denoted as TIA) and a differential amplifier. The TIA converts a photocurrent into a voltage signal. The differential amplifier amplifies this voltage signal and converts the single phase signal to two signals complementary to each other. The output of the TIA is filtered and led to one of inputs of the differential amplifier.

When the transistors implemented within the differential amplifier show lesser breakdown characteristic, namely, the collector current of the transistor increases at high collector biases even when the base bias current is kept low, the complementary signals output from the differential amplifier vary an offset voltage thereof depending on the input current.

SUMMARY OF THE INVENTION

An aspect of the present invention relates to a circuit that converts a single phase signal into two signals complementary to the others. The circuit comprises a differential circuit and a reference generator. The differential circuit includes two units and a current source commonly connected to the units. Each of units includes a differential transistor, a cascode transistor and a load resistor connected in series. One of units receives the single phase signal in the differential transistor thereof, while, the other of units receives an average voltage obtained by filtering the single phase signal. The reference generator generates a reference voltage which has a difference with respect to the average voltage. The cascode transistor in respective units is commonly biased by the reference voltage. A feature of the present invention, the difference between the reference voltage and the average voltage is substantially constant independent of an intensity of the signal phase input; accordingly, the collector bias of the differential transistor in respective units, which is lowered from the reference voltage by the base bias of the cascode transistor, may be substantially in constant independent of the single phase input and of the fluctuation of the power supply.

BRIEF DESCRIPTION OF DRAWINGS

The invention may be more completely understood in consideration of the following detailed description of various embodiments of the invention in connection with the accompanying drawings, in which.

DETAILED DESCRIPTION OF PREFERRED EMBODIMENTS

Figure 1:
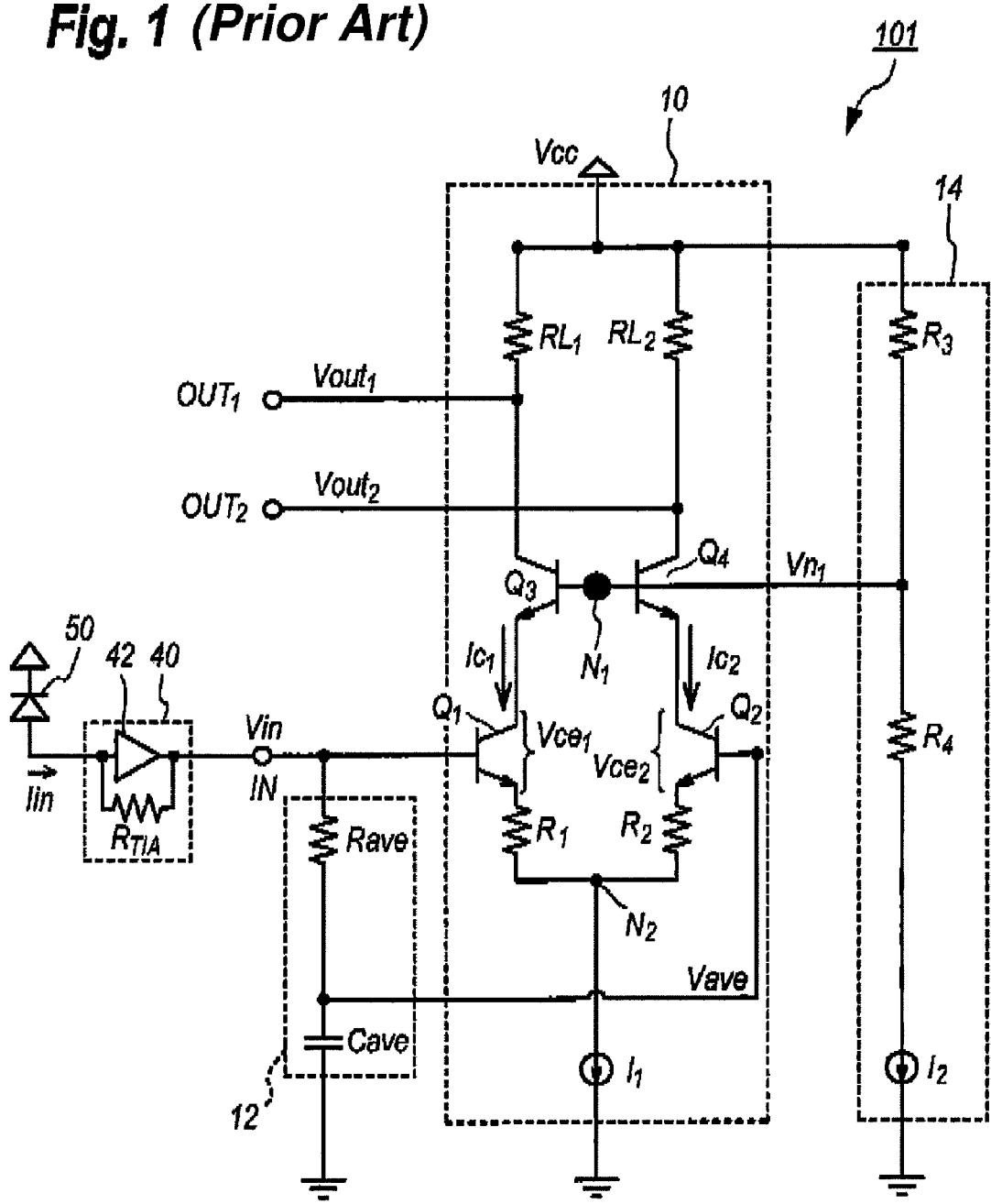
FIG. 1 is a circuit diagram of a conventional differential circuit.

First, a conventional example of an optical receiver will be described. FIG. 1 is a circuit diagram of the conventional conversion circuit 101 that comprises a differential circuit 10, a filter 12, and a reference generator 14. The input terminal IN of the differential circuit 10 receives an output Vin of the TIA 40 which includes an amplifier 42 and a trans-impedance $R_{TIA}$. The TIA 40 receives a photocurrent Iin output from a photodiode 50 and converts the photocurrent Iin into a voltage Vin which is provided to the input IN. The filter 12 includes a series circuit of a resistor Rave and a capacitor Cave between the input IN and the ground. The voltage Vin appeared in the input IN may be filtered by the filter 12 and an average voltage Vave is output from a node between the resistor Rave and the capacitor Cave. The reference generator 14 includes two resistors, $R_3$ and $R_4$, connected in series between the power supply Vcc and the ground, and a current source $I_2$. The reference generator 14 generates a reference voltage $Vn_1$ between two resistors, $R_3$ and $R_4$.

The differential circuit 10 includes first to fourth transistors, $Q_1$ to $Q_4$, two emitter resistors, $R_1$ and $R_2$, two load resistors, $RL_1$ and $RL_2$, and a current source $I_1$. The emitter of the first transistor $Q_1$ is grounded through a series circuit of the first emitter resistor $R_1$ and the current source $I_1$; the base thereof receives the input voltage Vin; and the collector thereof is connected to the emitter of the third transistor $Q_3$. The base of the third transistor $Q_3$ receives the reference voltage $Vn_1$, while, the collector receives the power supply yea through the first load resistor $RL_1$. The first output $OUT_1$ of the differential circuit 10 is extracted from the collector of the third transistor $Q_3$.

Similarly, the second transistor $Q_2$ is grounded in the emitter thereof through the series circuit of the second emitter resistor $R_2$ and the current source $I_1$; the base thereof receives the average voltage Vave of the filter 12; and the collector thereof is connected to the emitter of the fourth transistor $Q_4$. The base of the fourth transistor $Q_4$ receives the reference voltage $Vn_1$, while, the collector thereof is coupled with the power supply Vcc through the second load resistor $RL_2$. The other output $OUT_2$ of the differential circuit is extracted from the collector of the fourth transistor $Q_4$. In the circuit shown in FIG. 1, two transistors, $Q_2$ and $Q_4$, operate as a cascade transistor for respective driving transistors, $Q_1$ and $Q_2$.

Two outputs, $OUT_1$ and $OUT_2$, output signals, $Vout_1$ and $Vout_2$, complementary to the others. Because the base of the third transistor $Q_3$ and that of the fourth transistor $Q_4$ are commonly connected to the node $N_1$, which is the output of the reference generator 14, and receive the reference voltage $Vn_1$; and the emitters thereof are connected to respective collectors of the paired transistors, $Q_1$ and $Q_2$; accordingly, the collectors of the transistors, $Q_1$ and $Q_2$, are biased in a level decreased from the reference voltage $Vn_1$ by the base-emitter voltage Vbe of the transistors, $Q_3$ and $Q_4$.

Emitters of the transistors, $Q_1$ and $Q_2$, are commonly connected to the node $N_2$ through respective emitter resistors, $R_1$ and $R_2$. The emitter resistors, $R_1$ and $R_2$, may compensate an unbalanced state of the paired transistors, $Q_1$ and $Q_2$. That is, the base of the second transistor $Q_2$ receives the average voltage Vave of the filter 12, which is lowered from the input Vin by the bias current for the base of the second transistor $Q_2$ multiplied by the resistance of the resistor Rave. This input offset of the paired transistors, $Q_1$ and $Q_2$, may be compensated by differentiating the resistance of the emitter resistors, $R_1$ and $R_2$. Setting the resistance of the second resistor $R_2$ less than that of the first resistor $R_1$, the collector current $Ic_2$ of the second transistor $Q_2$ may be substantially equal to the collector current $Ic_1$ of the first transistor $Q_1$, which may set the output offset between two outputs, $Vout_1$ and $Vout_2$, complementary to the others. It is preferable to equalize the resistance of two load resistors, $RL_1$ and $RL_2$, not only for compensating the output offset but equalizing the voltage gain of the paired transistors, $Q_1$ and $Q_2$. Moreover, the desired output offset may be set by adjusting the balance of two emitter resistors, $R_1$ and $R_2$.

In the passive optical network system, which is often called as the PON system, the input optical level detected by the PD 50 widely diffuses depending on respective subscribers. Even in such cases, the differential circuit 10 may output signals, $Vout_1$ and $Vout_2$, complementary to each other by differentiating the input voltage signal Vin from the filtered average voltage Vave.

However, the circuit 101 fixes the voltage level $Vn_1$ at the node $N_1$ by the reference generator 14; accordingly, the paired transistors, $Q_1$ and ( ), are biased in the collector thereof by the voltage level $Vn_1$ lowered by the base-emitter voltage $V_{be}$ of the transistors, $Q_3$ and $Q_4$.

Figure 2:
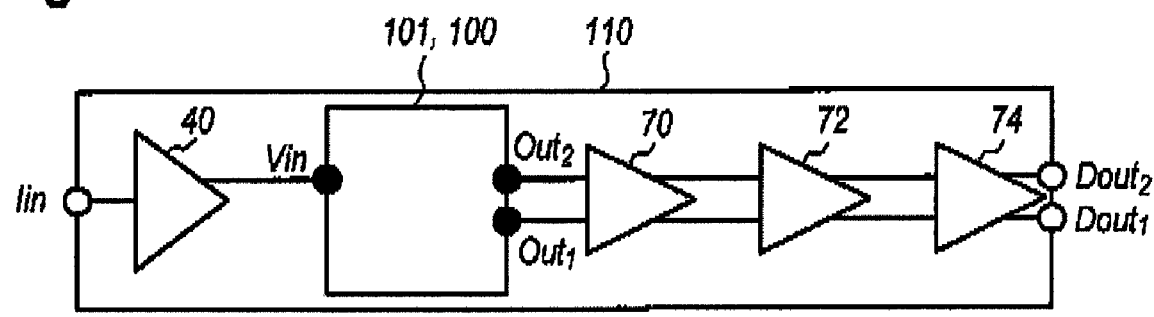
FIG. 2 is a block diagram of a receiver circuit that implements the differential circuit shown in FIG. 1.

FIG. 2 is a block diagram of an optical receiver circuit 110 that may be implemented with the conventional circuit 101 or a circuit 100 according to the present invention. The receiver circuit 110 includes the TIA 40, the circuit, 100 or 101, and buffers, 70 to 74. The TIA 40 receives the input Iin, while, the buffer 74 outputs signals, $Dout_1$ and $Dout_2$, which are complementary to each other. The circuit, 100 or 101, may provide a plurality of buffers, 70 to 74, in a downstream side thereof to ensure a necessary voltage gain. When the circuit 101 or 100, has an enough gain, the downstream buffers, 70 to 74, may decrease the number thereof, or may be fully omitted.

Figure 3:
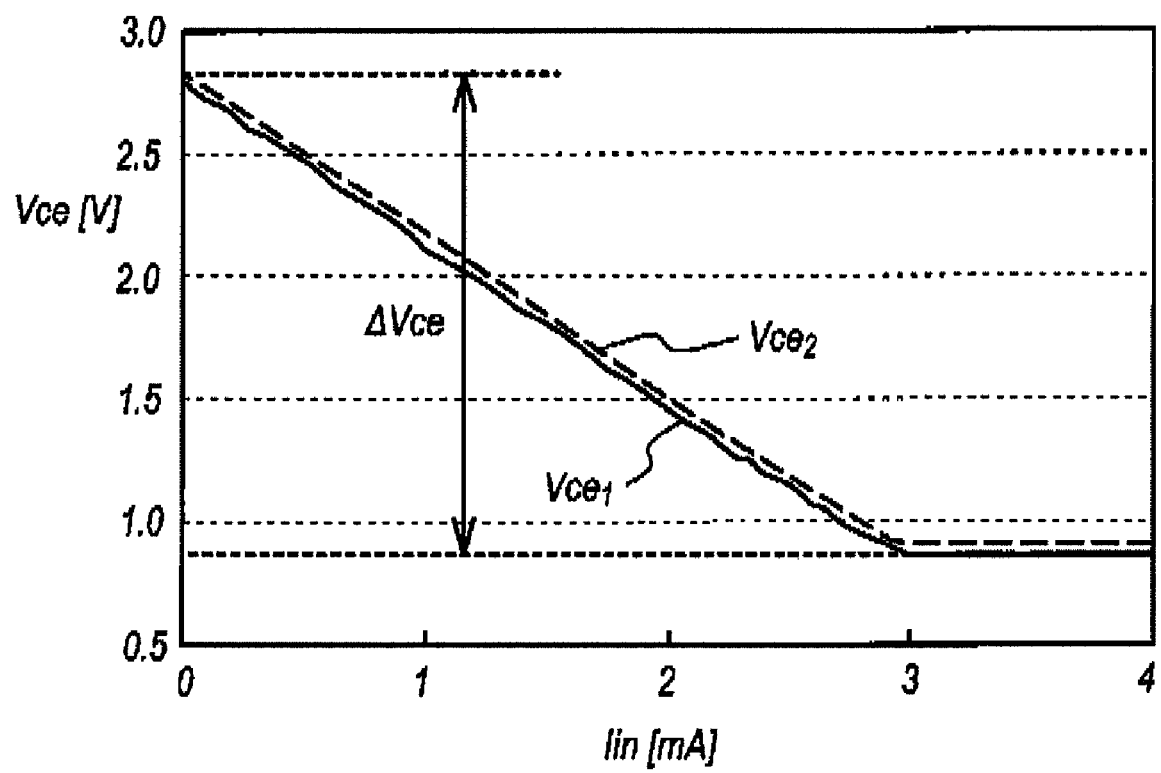
FIG. 3 shows behaviors of the collector bias of the transistor applied to the differential circuit.

FIG. 3 shows behaviors of the collector bias, $Vce_1$ and $Vce_2$, of the paired transistors, $Q_1$ and $Q_2$, with respect to the input current Iin of the TIA 40. The collector biases, $Vce_1$ and $Vce_2$, widely vary as varying the input current Iin. For instance, as shown in FIG. 3, the collector biases, $Vce_1$ and $Vce_2$, vary by $\Delta Vce$ for the input current Iin up to 3 mA. Because the inputs of the paired transistors, $Q_1$ and $Q_2$, are unbalanced as described above; specifically, the input of the transistor $Q_2$ is lowered by the resistor Rave and the base bias current flowing therein, the circuit, 100 or 101, may compensate this unbalance by adjusting the resistance of two emitter resistors, $R_1$ and $R_2$, so as to set the collector bias $Vce_2$ of the second transistor $Q_2$ slightly greater than that $Vce_1$ of the first transistor $Q_1$.

Figure 4:
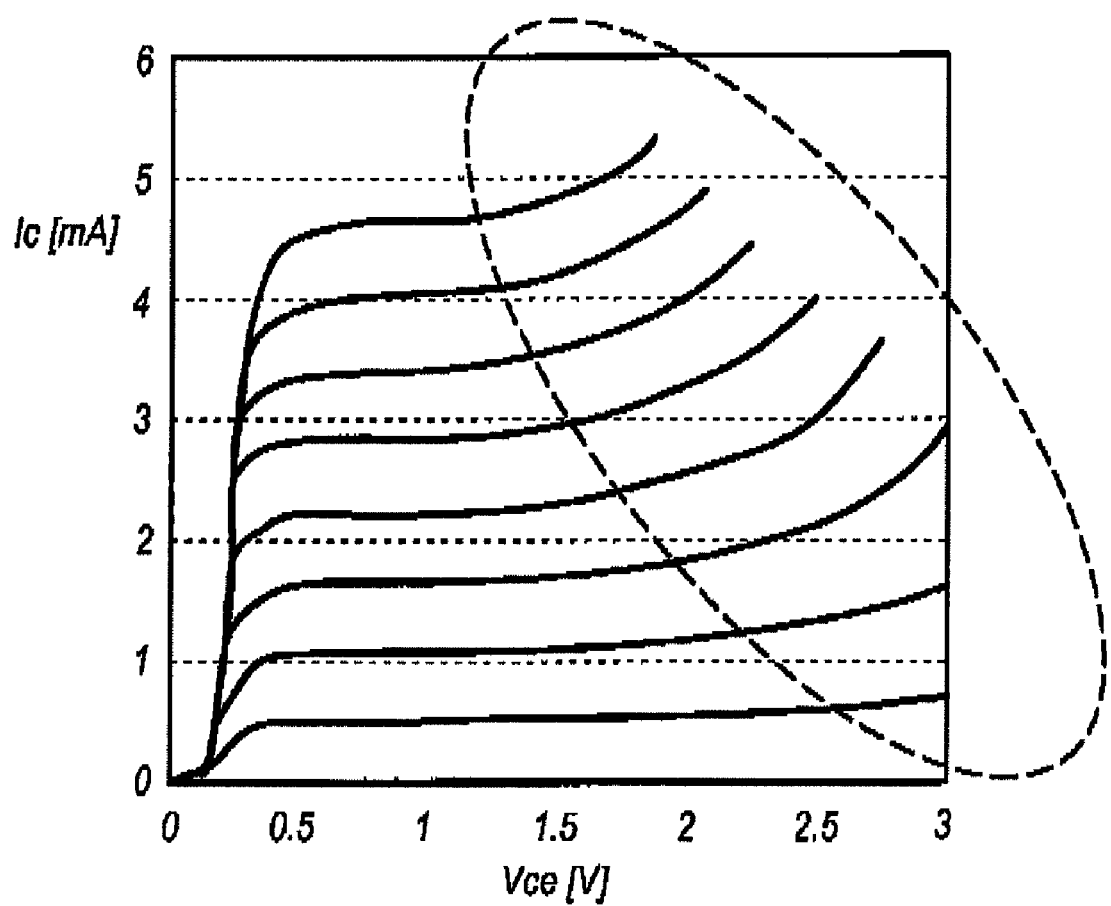
FIG. 4 shows a behavior of the collector current Ic against the collector bias Vce of a bipolar transistor applied to the paired transistor of the differential circuit.
Figure 5:
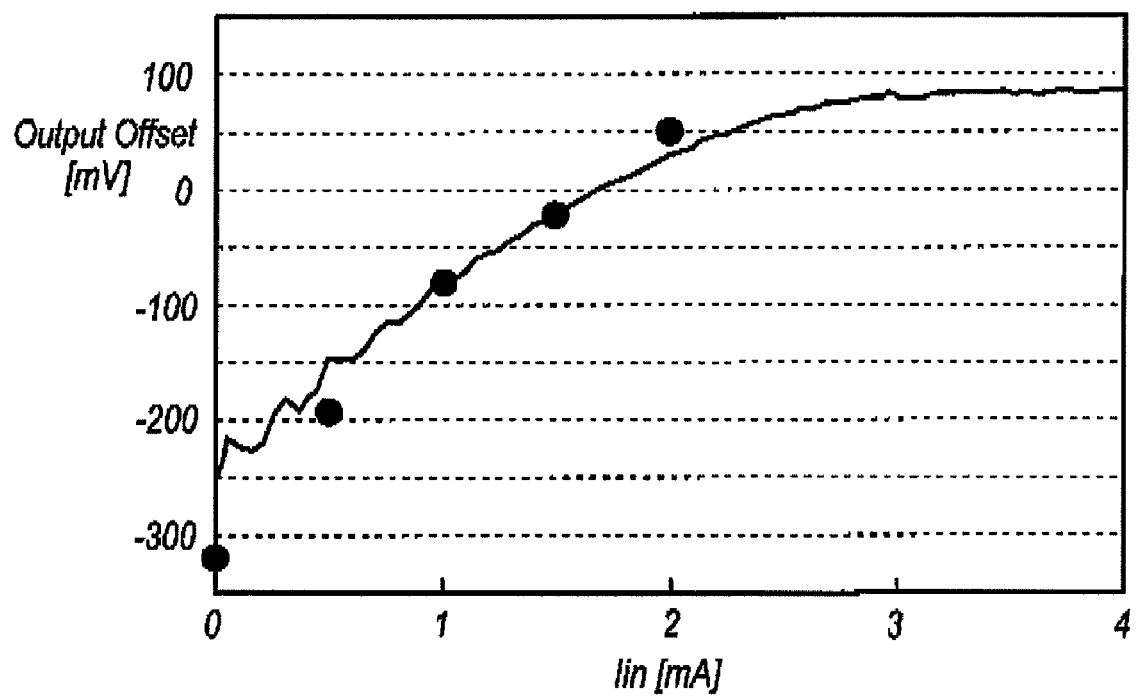
FIG. 5 shows a behavior of an output offset voltage of the differential amplifier against the input current.

FIG. 5 shows the output offset voltage between two outputs, $Vout_1$ and $Vout_2$, with respect to the input current Iin of the TIA 40. In FIG. 5, filled circles correspond to simulation results, while, open circles correspond to measured results. In these analyses, four transistors, $Q_1$ to $Q_4$, whose static characteristics are shown in FIG. 4, are used. That is, transistors, $Q_1$ to $Q_4$, are a type of the hetero-bipolar transistor (HBT) made of InP based material. Such HBTs clearly show semi-breakdown behaviors when the collector bias Vce exceeds 2 volts as shown by a broken circle. The node voltage $Vn_1$, the power supply voltage Vcc, the resistance of resistors, $R_{ave}$, $R_1$, $R_2$, $RL_1$ and $RL_2$, are assumed to be 4.6V, −5.2V, 2 kΩ, 58.8Ω, 12.5Ω, 200Ω and 200Ω, respectively. The capacitance of the capacitor Cave is assumed to be 2.2 nF.

As shown in FIG. 5, the collector biases, $Vce_1$ and $Vce_2$, increase as the input current Iin becomes large, which causes the semi-breakdown in the transistors, $Q_1$ and $Q_2$, as shown in FIG. 3 and the output offset voltage increases. Thus, when the transistors, $Q_1$ and $Q_2$, have lesser performance in the breakdown voltage for the collector bias Vce, the output offset voltage between complementary outputs, $Vout_1$ and $Vout_2$, depends on the input. That is, the output offset voltage is hard to be kept in a preset level for the conventional circuit 101.

Next, preferred embodiments according to the present invention will be described in detail, where the embodiments may suppress the output offset voltage between the complementary signals.

First Embodiment

Figure 6:
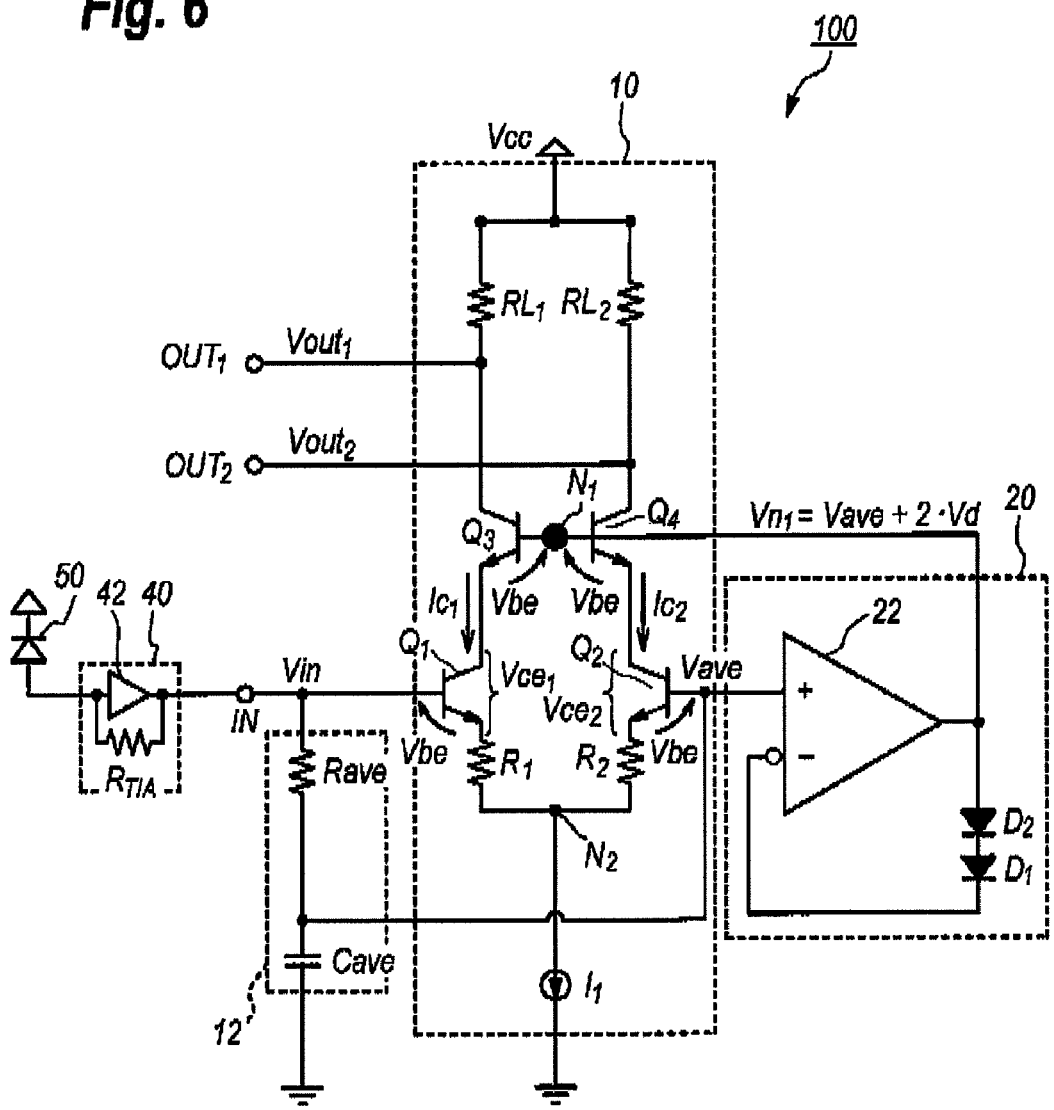
FIG. 6 is a circuit diagram of a differential amplifier according to the first embodiment of the invention.

FIG. 6 is a circuit diagram according to the first embodiment of the present invention. The differential circuit 100 substitutes the reference generator 14 shown in FIG. 1 with another reference generator 20 to generate a base bias for the cascode transistors. The reference generator 20 includes a differential amplifier 22 that provides a non-inverting input for receiving the filtered output Vave and two diodes, $D_1$ and $D_2$, forwardly connected between the output and the inverting input of the differential amplifier 22. According to the circuit shown in FIG. 6, the output voltage $Vn_1$ of the reference generator 20 becomes higher than the input Vave thereof by a value twice of a turn-on voltage Vt of a junction diode; that is:

$$Vn_1 = Vave + 2 \times Vt.$$

Thus, the reference generator 20 may set the voltage difference between the input Vave and the node voltage $Vn_1$. Moreover, this voltage difference may be variable by selecting a number of diodes connected in series between the output and the inverting input thereof.

Because the base biases Vbe of the transistors, $Q_1$ to $Q_4$, are automatically set to be the turn-on voltage Vt of a diode, which is typically about, 0.7V, the collector bias $Vce_2$ of the second transistor $Q_2$ may become substantially equal to twice of the turn-on voltage 2×Vt. Although the collector bias $Vce_1$ of the first transistor $Q_1$ becomes higher than that $Vce_2$, ~2×Vt, of the second transistor $Q_2$ by a voltage drop by the third resistor Rave due to the base bias current therefore, the emitter resistors, $R_1$ and $R_2$, may compensate this unbalanced bias.

According to the first embodiment of the present invention, the reference generator 20 may keep the collector bias Vce of the transistors, $Q_1$ and $Q_2$, measured from the base input Vave of the second transistor $Q_2$ substantially in constant independent of the input current Iin. The output offset voltage of the complimentary signals, $Vout_1$ and $Vout_2$, may be independent of the input current Iin.

Second Embodiment

Figure 7:
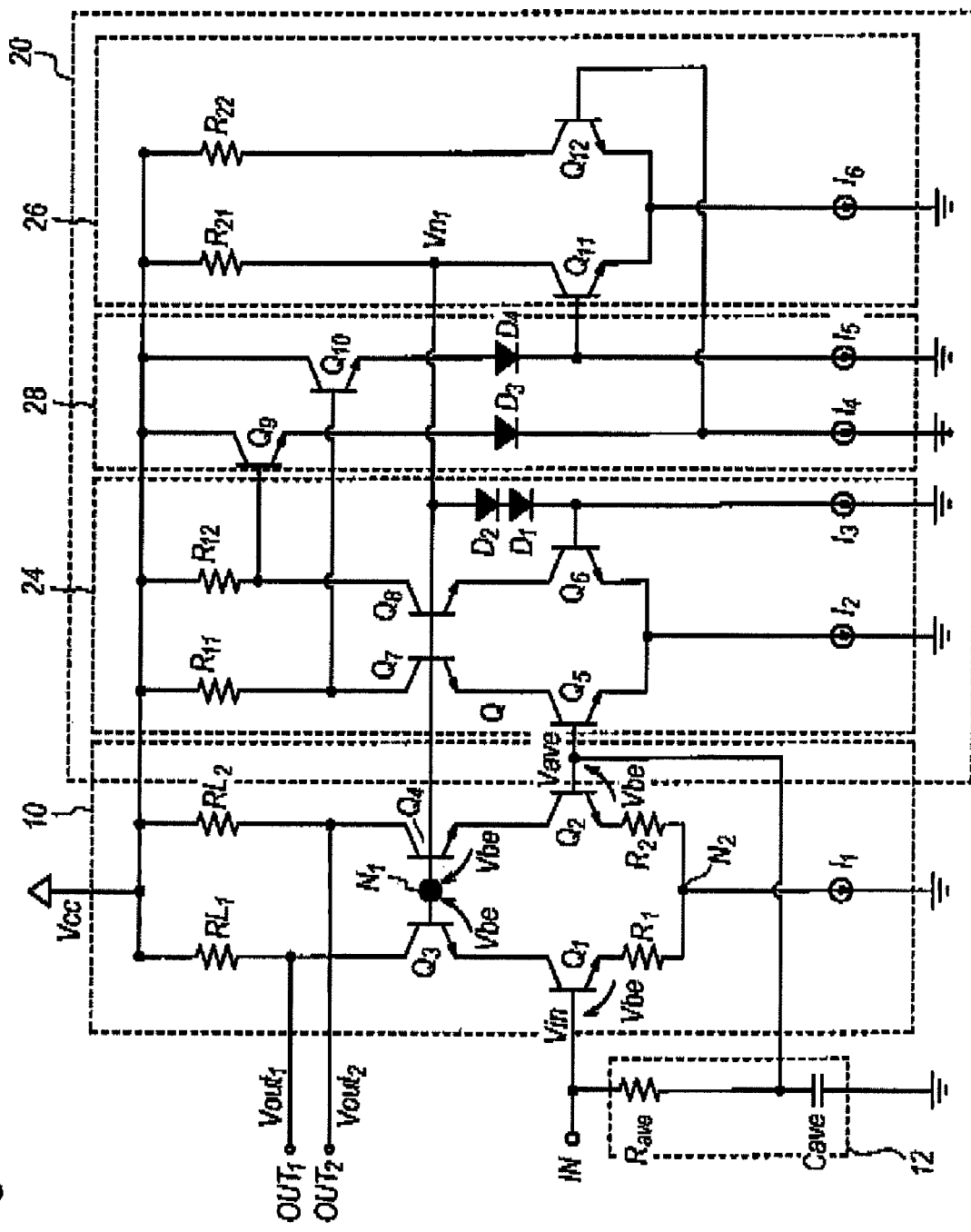
FIG. 7 is a circuit diagram, of a differential amplifier according to the second embodiment of the invention.

FIG. 7 is a circuit diagram which specifically reflects the circuit shown in FIG. 6. The TIA 40 and the PD 50 are not shown in FIG. 7. The reference generator 20 to generate the base bias voltage includes 2 differential amplifiers, 24 and 26, connected in series and an emitter follower 28. The first differential amplifier 24 includes 4 transistors, $Q_5$ to $Q_8$, two load resistors, $R_{11}$ and $R_{12}$, and 2 current sources, $I_2$ and $I_3$. The resistor two transistors, $Q_7$ and $Q_5$, and the current source $I_2$ are connected in series between the power supply Vcc and the ground. Specifically, the emitter of the transistor $Q_5$ is grounded through the current source $I_2$, while the collector thereof is connected to the emitter of the other transistor $Q_7$. The collector of the transistor $Q_7$ is biased by the power supply Vcc through the resistor $R_{11}$. Similarly, the resistor $R_{12}$, two transistors, $Q_8$ and $Q_6$, and the current source $I_2$ are connected in series in this order between the power supply Vcc and the ground. The emitter of the transistor $Q_5$ is grounded through the current source $I_2$, while, the collector thereof is coupled with the emitter of the other transistor $Q_8$. The collector of the other transistor $Q_8$ is biased by the power supply Vcc through the resistor $R_{12}$. Bases of two transistors, $Q_7$ and $Q_8$, are commonly connected to the node $N_1$, which is the output of the reference generator 20, that is, the anode of the diode $D_2$ connected in series. The cathode of the diode $D_1$ is coupled with the base of the transistor $Q_6$ but grounded through the other current source $I_3$. The output Vave of the filter 12 is led to the base of the transistor $Q_5$.

The emitter follower 28 includes two transistors, $Q_9$ and $Q_{10}$, two diodes, $D_3$ and $D_4$, and two current sources, $I_4$ and $I_5$. One of units including the transistor $Q_9$, the diode $D_3$ and the current source $I_4$ is connected between the power supply Vcc and the ground; while, the other unit including the transistor $Q_{10}$, the diode $D_4$ and the current source $I_5$ is also connected between the power supply Vcc and the ground. Two diodes, $D_3$ and $D_4$, may adjust the output level led from the cathode thereof with respect to the input provided to the base of the transistors, $Q_9$ and $Q_{10}$. Although the embodiment shown in FIG. 7 provides only one diode in respective units, two or more diodes may be implemented.

Signals whose level is dropped by the emitter follower 28 are led to the second differential amplifier 26. The differential amplifier 26 includes two transistors, $Q_{11}$ and $Q_{12}$, two resistors, $R_{21}$ and $R_{22}$, and the current source $I_6$. The transistor $Q_{11}$ and the resistor 21 constitute the left unit; while, the transistor $Q_{12}$ and the resistor $R_{22}$ constitute the right unit. Two units are commonly connected to the current source $I_6$. The output of the second differential amplifier 26, which is provided from the collector of the transistor $Q_{11}$ is led to the node $N_1$ with the voltage of $Vn_1$.

Figure 8:
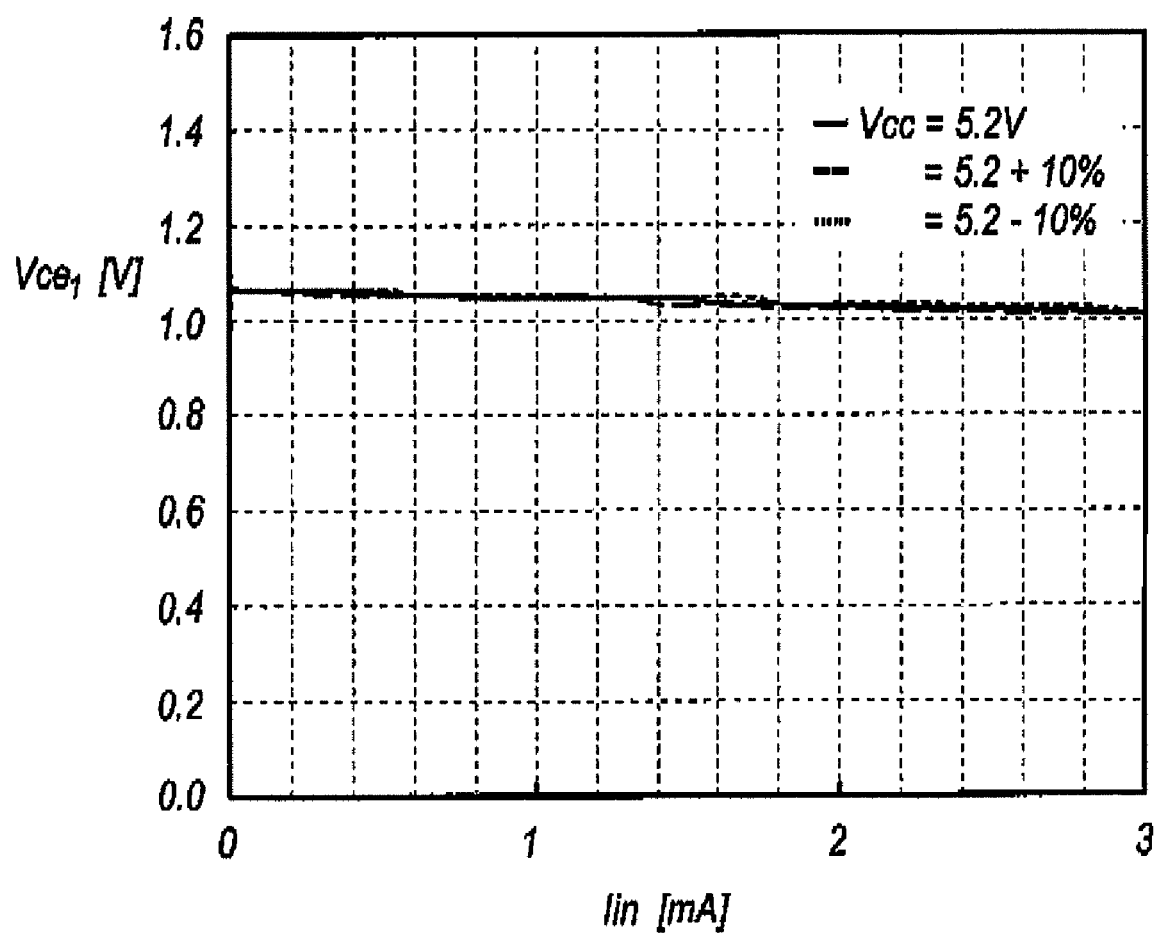
FIG. 8 shows behaviors of the collector bias Vce of the transistor applied to the differential circuit shown in FIG. 7 against the input current Iin.

FIG. 8 shows behaviors of the collector bias $Vce_1$ of the transistor $Q_1$ against the input current Iin to the TIA 40. In this analysis, transistors, $Q_1$ to $Q_{12}$, are assumed to be a type of InP-HBT and have a characteristic substantially same with those shown in FIG. 4. An operating temperature of the transistors, the turn-on voltage Vt, the resistance of the load resistors, $R_{11}$ and $R_{12}$ and the resistance of the load resistors, $R_{21}$ and $R_{22}$, are 45° C., 0.7V, 3.2 kΩ, and 3.0 kΩ, respectively. One of load resistors $R_{22}$ in the second differential amplifier 26 may be replaced to a diode. In FIG. 8, the solid line is obtained in a condition where the power supply is 5.2V, the broken line corresponds to a condition where the power supply is increased by +10% from the standard (5.2V), while, the dotted line corresponds to a condition where the power supply is decreased by −10% from the standard. Even when the input current Iin varies to 3 mA; moreover even the power supply fluctuates, the collector bias $Vce_1$ of the transistor $Q_1$ may be kept substantially in constant.

Figure 9:
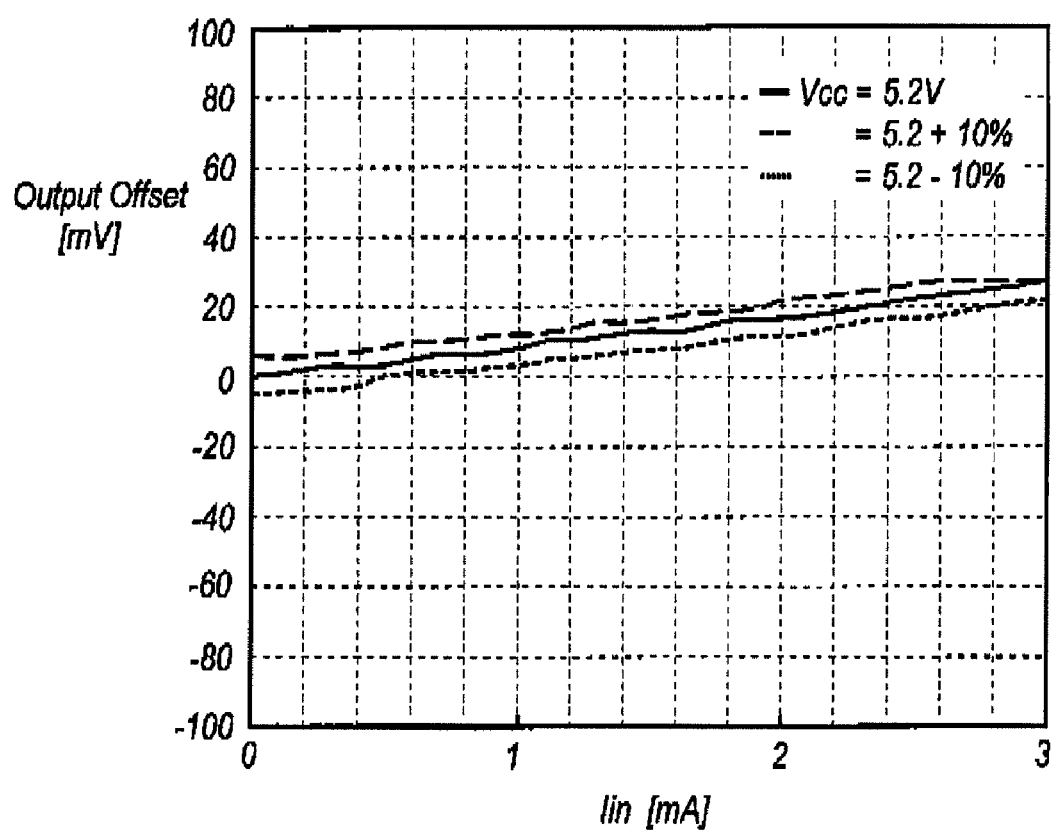
FIG. 9 shows behaviors of the output offset of the complementary signals output from the receiver circuit shown in FIG. 2 against the input current as varying the power supply.

FIG. 9 shows the output offset voltage $Vout_1-Vout_2$ of the circuit 100 against the input current Iin. Solid, broken, and dotted lines correspond to the conditions of the power supply of 5.2V, 5.2V+10%, and 5.2V−10%, respectively. As shown in FIG. 9, the output offset voltage may be kept small, less than 30 mV, even the input current Iin and the power supply Vcc vary.

Third Embodiment

Figure 10:
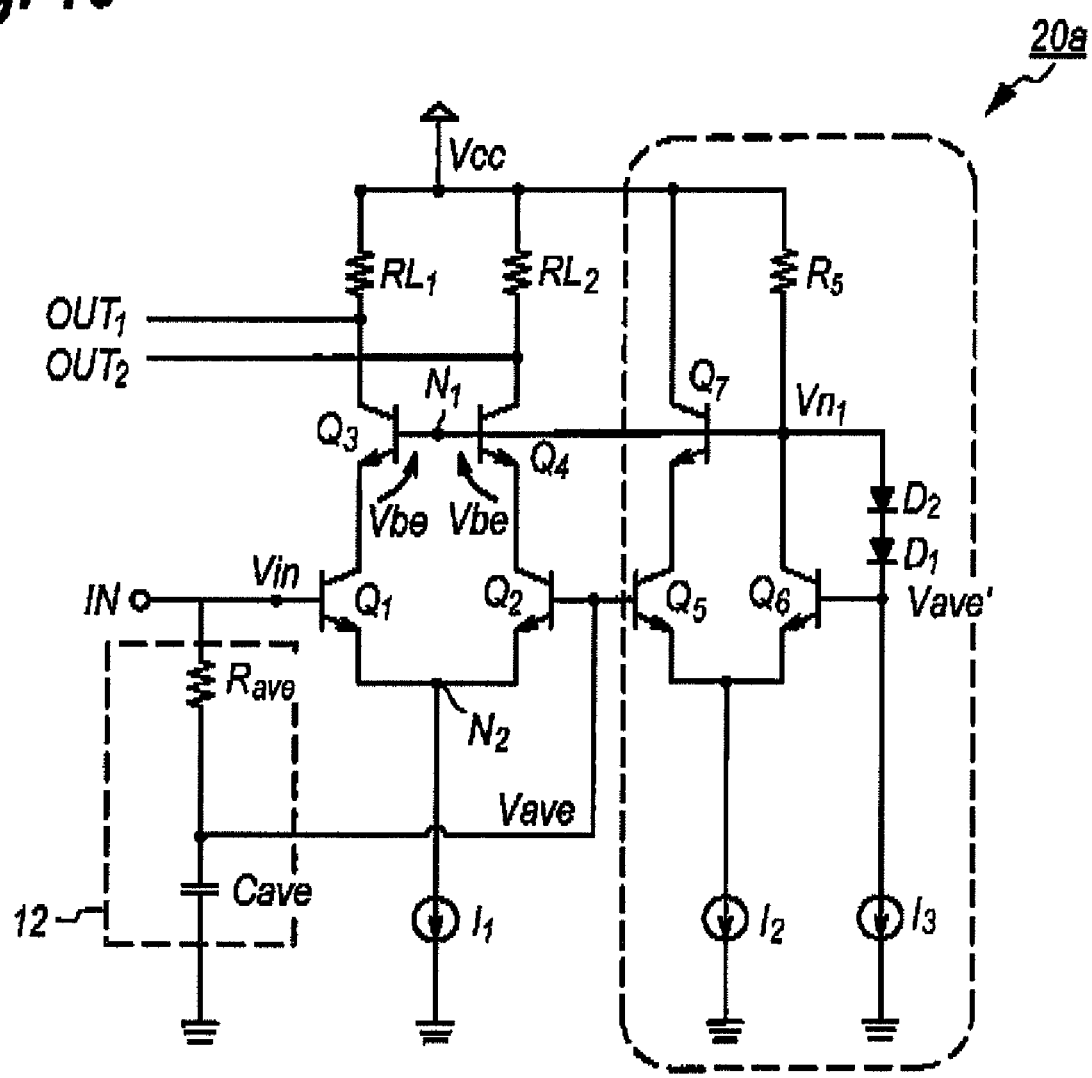
FIG. 10 shows a circuit diagram of a differential amplifier according to the third embodiment of the present invention.

A circuit according to the third embodiment of the invention simplifies the differential amplifier in the reference generator 20 of the second embodiment. FIG. 10 is a circuit diagram of the reference generator 20a according to the third embodiment of the invention. The reference generator 20a of the present embodiment includes three transistors, $Q_5$ to $Q_7$, a resistor $R_5$ and two current sources, $I_2$ and $I_3$. The transistors, $Q_7$ and $Q_5$, constitute the left unit, while the resistor $R_5$ and the transistor $Q_6$ constitute the right unit. Two units are commonly connected to the current source $I_2$ and grounded through the current source $I_2$. The collector of the transistor $Q_7$ is directly connected to the power supply Vcc, while, the transistor $Q_6$ is biased by the power supply through the resistor $R_5$. The reference generator 20a of the present embodiment further includes two diodes, $D_1$ and $D_2$, and another current source $I_3$. Two diodes, $D_1$ and $D_2$, are forwardly connected between the collector and the base of the transistor $Q_6$, while, the other current source $I_3$ extracts the current from the diodes, $D_3$, and $D_2$.

The reference generator 20a includes a differential amplifier that outputs the node voltage $Vn_1$ by receiving two inputs, Vave and Vave'. The latter inputs Vave' are fed back from the output $Vn_1$ through two diodes, $D_1$ and $D_2$. Thus, the inverting input Vave' may be lowered by a value which is twice of the turn-on voltage of the diode, 2×Vt; in other words, the output $Vn_1$ of the reference generator 20a may be kept higher than the input Vave' of the differential circuit by the value twice of the turn-on voltage $2 \times V_t$.

While there has been illustrated and described what are presently considered to be example embodiments of the present invention, it will be understood by those skilled in the art that various modifications may be made, and equivalents may be substituted, without departing from the true scope of the invention. Additionally, many modifications may be made to adapt a particular situation to the teachings of the present invention without departing from the central inventive concept described herein. For instance, embodiments above described adjust the emitter resistors, $R_1$ and $R_2$, so as to suppress the output offset voltage; however, the emitter resistors, $R_1$ and $R_2$, may be set in the resistance thereof so as to set a preset offset voltage in the output of the receiver circuit 110. Therefore, it is intended that the present invention not be limited to the particular embodiments disclosed, but that the invention include all embodiments falling within the scope of the appended claims.

What is claimed is:

1. A differential amplifier configured to convert a single phase signal into two signals complementary to each other, comprising:
a pair of differential transistors, one of differential transistors receiving a modulating signal and another of differential transistors receiving an average voltage generated by filtering said modulating signal, said differential transistors constituting a differential circuit accompanied with a current source commonly connected to respective emitters of said differential transistors;
a reference generator configured to generates a reference voltage by receiving said average voltage, said reference voltage having a difference substantially constant with respect to said average voltage; and first and second cascode transistors, said first cascode transistor being connected to said one of differential transistors and said second cascode transistor being connected to said another differential transistor, said first and second cascode transistors being commonly biased in a base thereof by said reference voltage.

2. The differential amplifier of claim 1,
wherein each of said differential transistors has an emitter connected to a current source through respective emitter resistors each having resistance different to each other.

3. The differential amplifier of claim 1,
wherein said reference generator includes another differential circuit having a non-inverting input, an inverting input and an output, said non-inverting input receiving said average voltage, said output generating said reference voltage,
wherein said another differential circuit further includes a diode forwardly connected between said output and said inverting input of said another differential circuit.

4. The differential amplifier of claim 3,
wherein said diode causes a voltage corresponding to a turn-on voltage of a junction diode between said output and said inverting input of said another differential circuit.

5. The differential amplifier of claim 4,
wherein said another differential circuit further includes a current source connected to said inverting input, said current source flowing an idle current in said diode connected between said output and said inverting input of said another differential circuit.

6. The differential amplifier of claim of claim 1,
wherein said reference generator includes another differential circuit having a non-inverting input, an inverting input and an output, said non-inverting input receiving said average voltage, said output generating said reference voltage,
wherein said another differential circuit further includes a plurality of diodes between said output and said inverting input of said another differential circuit, each of said diodes being forwardly connected in series.

7. The differential amplifier of claim 6,
wherein said another differential circuit further includes a current source connected to said inverting input, said current source flowing an idle current in said diodes connected between said output and said inverting input of said another differential circuit.

8. A circuit for converting a single phase signal to two signals complementary to each other, comprising:
a differential circuit including a pair of units and a current source, each of said units including a differential transistor, a cascode transistor and a resistor connected in series to each other,
wherein said differential transistor in respective units has an emitter connected to said current source, said differential transistor in one of said units receives said single phase input and said differential transistor in another of said units receives an average voltage generated by filtering said single phase input,
wherein said cascode transistor in respective units has a base commonly biased by a reference voltage and outputs one of said signals complementary to others; and
a reference generator includes a plurality of diodes, a non-inverting input, an inverting input and an output,
wherein said non-inverting input receives said average voltage, and said diodes are forwardly connected between said output and said inverting input of said reference generator,
wherein said reference generator provides said reference voltage to said cascode transistor in respective units.

9. The circuit of claim 8,
wherein each of said units further includes an emitter resistor connected between said differential transistor and said current source,
wherein each of said emitter resistors has resistance different from others.

10. The circuit of claim 8,
wherein said diodes generate a voltage drop corresponding to a turn-on voltage of a junction diode multiplied by a number of said diodes between said output and said inverting input of said reference generator.

11. The circuit of claim 10,
wherein said reference generator further includes a current source connected to said inverting input, said current source flowing an idle current in said diodes connected between said output and said inverting input of said other differential amplifier.

* * * * *